United States Patent
Yu

(10) Patent No.: US 9,207,716 B2
(45) Date of Patent: Dec. 8, 2015

(54) ELECTRONIC DEVICE WITH DISPLAY

(71) Applicant: HON HAI PRECISION INDUSTRY CO., LTD., New Taipei (TW)

(72) Inventor: Shu-Fang Yu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 138 days.

(21) Appl. No.: 14/150,791

(22) Filed: Jan. 9, 2014

(65) Prior Publication Data

US 2014/0211398 A1   Jul. 31, 2014

(30) Foreign Application Priority Data

Jan. 25, 2013   (TW) .............................. 102102746 A

(51) Int. Cl.
*G06F 1/16* (2006.01)
*H05K 1/02* (2006.01)
*H05K 1/18* (2006.01)

(52) U.S. Cl.
CPC ............ *G06F 1/1637* (2013.01); *G06F 1/1683* (2013.01); *H05K 1/028* (2013.01); *H05K 1/189* (2013.01); *H05K 2201/10128* (2013.01); *H05K 2201/10189* (2013.01)

(58) Field of Classification Search
USPC ................. 349/12, 65, 153, 158; 361/679.09, 361/679.02, 679.21, 679.55, 679.48, 361/679.46, 679.27, 679.56, 679.31, 361/679.54, 679.12, 679.28, 679.08, 361/679.05, 679.26, 679.41, 679.22, 361/679.53, 679.33, 679.47, 679.39, 679.2; 438/127, 109; 312/295, 232.2, 348.4, 312/236, 223.1, 317.1, 326, 108; 455/456.1, 90.2, 550.1, 456.3, 41.1, 455/404.2, 193.1, 289; 345/520, 156, 213, 345/99, 204, 173, 168, 629, 501, 1.3, 102, 345/581, 690, 77, 207, 211, 420

See application file for complete search history.

(56) References Cited

U.S. PATENT DOCUMENTS

| | | | |
|---|---|---|---|
| 6,727,894 B1 * | 4/2004 | Karidis et al. | 345/174 |
| 2013/0069878 A1 * | 3/2013 | Li | 345/168 |
| 2014/0126132 A1 * | 5/2014 | Quijano et al. | 361/679.22 |
| 2014/0211398 A1 * | 7/2014 | Yu | 361/679.26 |

* cited by examiner

*Primary Examiner* — Hung Duong
(74) *Attorney, Agent, or Firm* — Novak Druce Connolly Bove + Quigg LLP

(57) ABSTRACT

An electronic device includes a base, a display, and a connecting member. The base includes a motherboard. The display is rotatably mounted to the base and includes a cover and a screen. The connecting member is configured for connecting the display and the motherboard and includes a second group of connecting wires and a FPCB with a first group of connecting wires. A gap is defined between the cover and the screen. The first group of connecting wires is electronically connected to the screen. The second group of connecting wires is electronically connected to the motherboard. The FPCB extends into the gap.

19 Claims, 9 Drawing Sheets

ELECTRONIC DEVICE WITH DISPLAY

BACKGROUND

1. Technical Field

The present disclosure relates to electronic devices, and particularly to an electronic device with a display.

2. Description of Related Art

An electronic device with a display, such as a notebook, transfers signals between the display and a motherboard via metal wires. The metal wires are twisted into a connecting line. A first connector, secured to the motherboard, is connected to a first end of the connecting line. A second connector, secured to the display, is connected to a second end of the connecting line. However, a thickness of the connecting line is at least 0.5 mm, which sets a lower limit of an overall thickness of the display. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
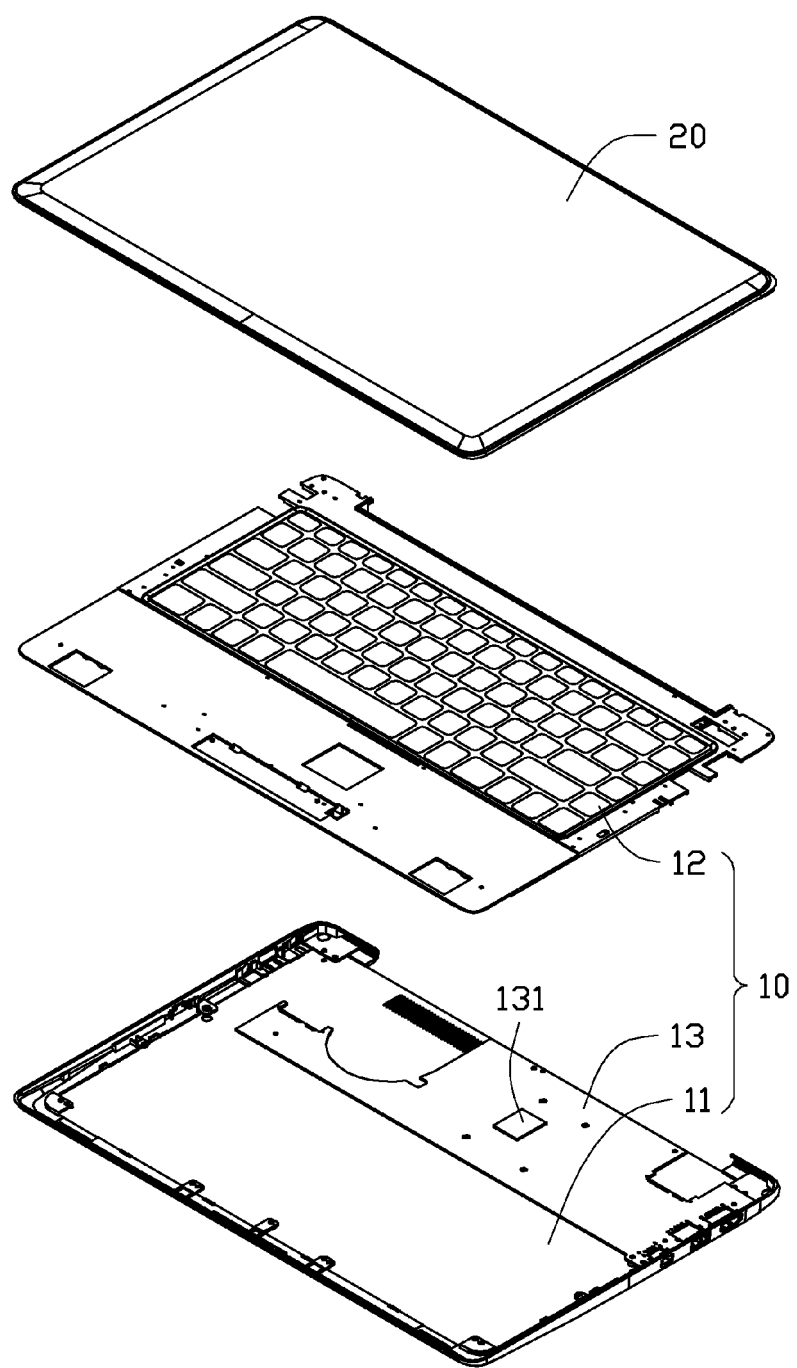
FIG. 1 is an exploded, isometric view of one embodiment of an electronic device.

FIG. 1 shows one embodiment of an electronic device. The electronic device comprises a base 10 and a display 20 rotatably secured to a side of the base 10.

The base 10 comprises a bottom cover 11, a keyboard 12, and a motherboard 13. The keyboard 12 and the motherboard 13 are secured to the bottom cover 11. A board connector 131 is secured on the motherboard 13. In one embodiment, the keyboard 12 is substantially parallel to the motherboard 13 and the bottom cover 11.

Figure 2:
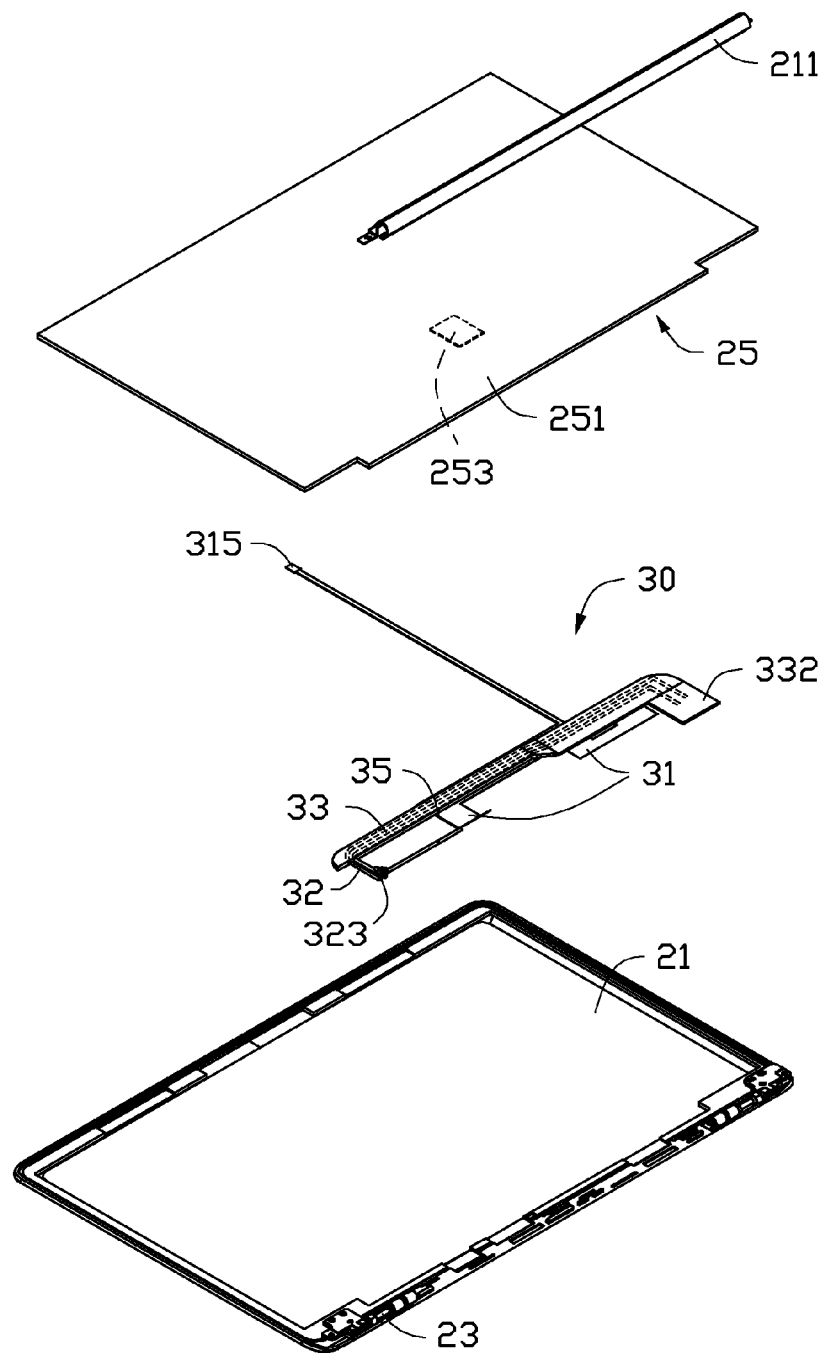
FIG. 2 is an exploded, isometric view of a display of the electronic device of FIG. 1.
Figure 3:
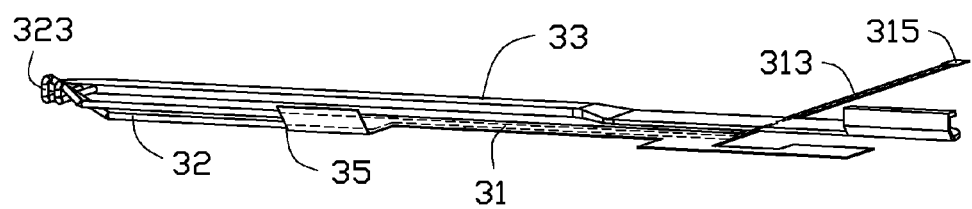
FIG. 3 is an isometric view of a connecting member of the display of FIG. 2.
Figure 4:
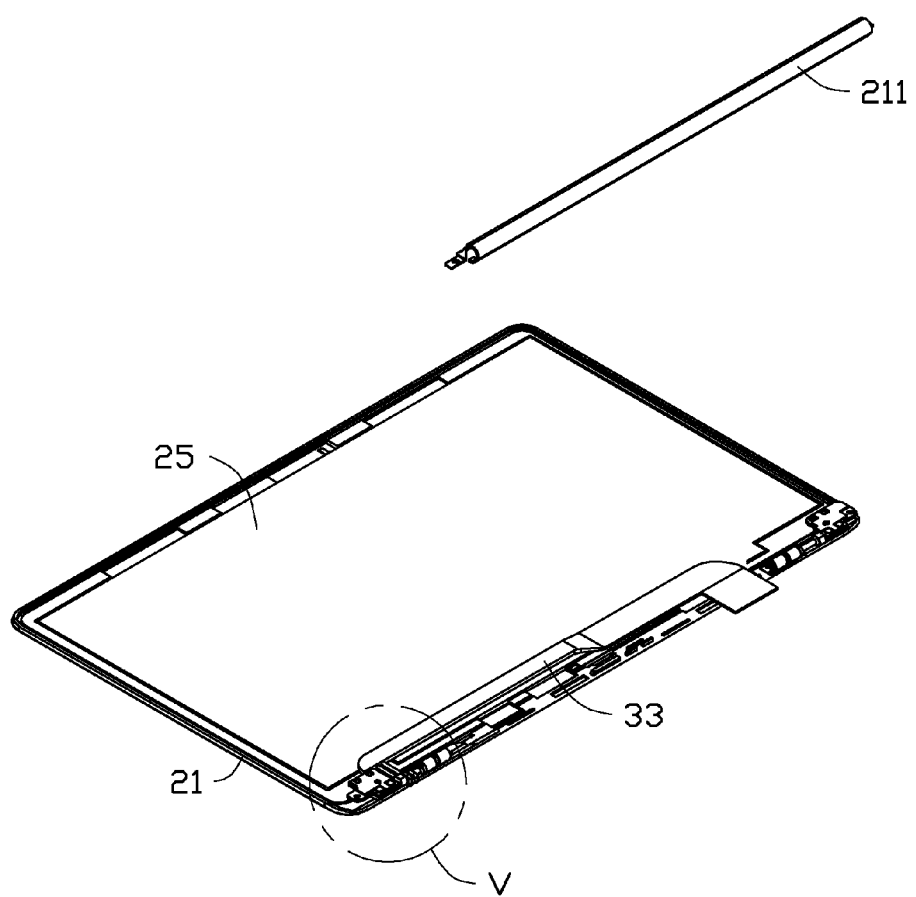
FIG. 4 is a partially assembled, isometric view of the display of FIG. 2.
Figure 5:
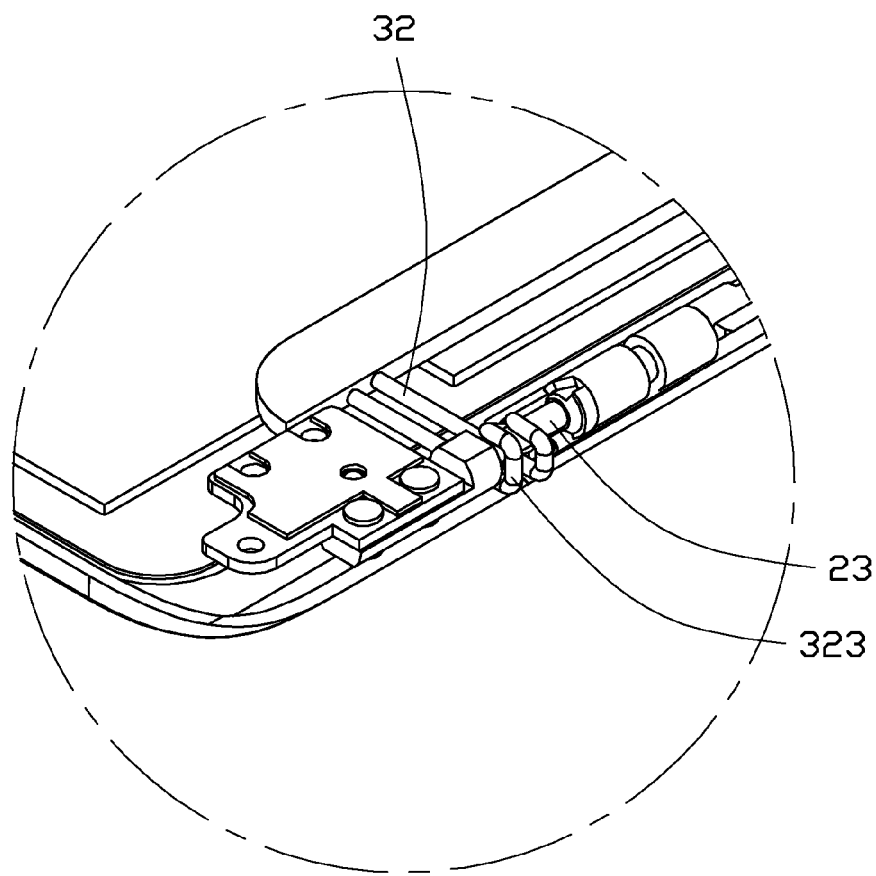
FIG. 5 is an enlarged view of a circled portion V of the electronic device of FIG. 4.
Figure 6:
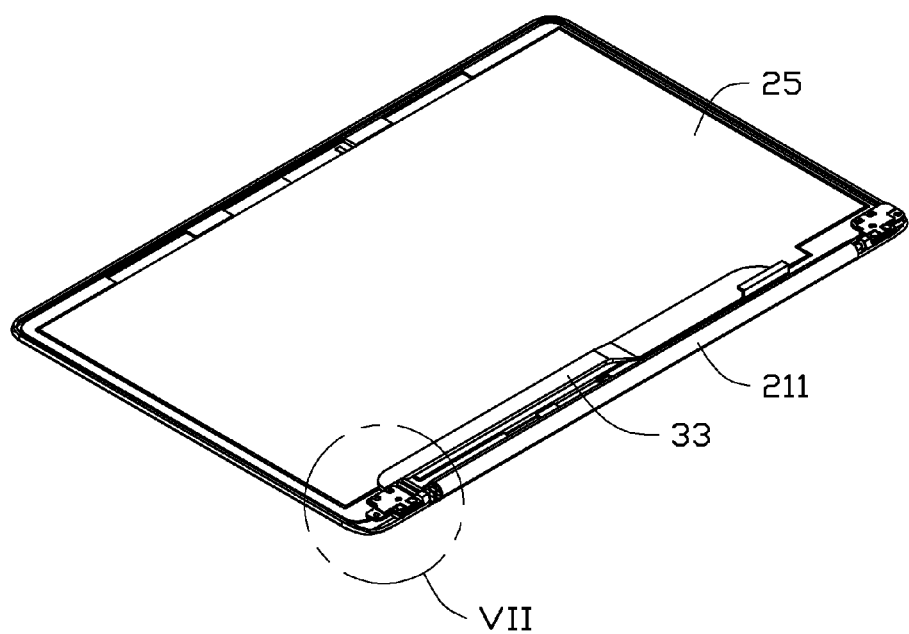
FIG. 6 is an assembled, isometric view of the display of FIG. 2.
Figure 7:
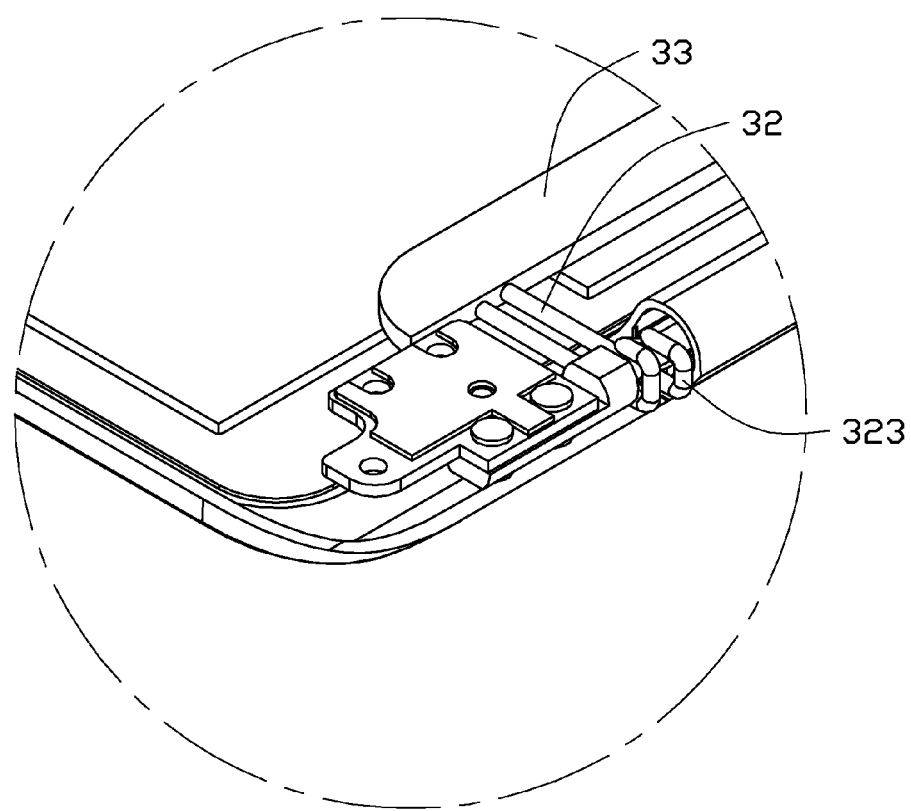
FIG. 7 is an enlarged view of a circled portion VII of the assembled display of FIG. 6.
Figure 8:
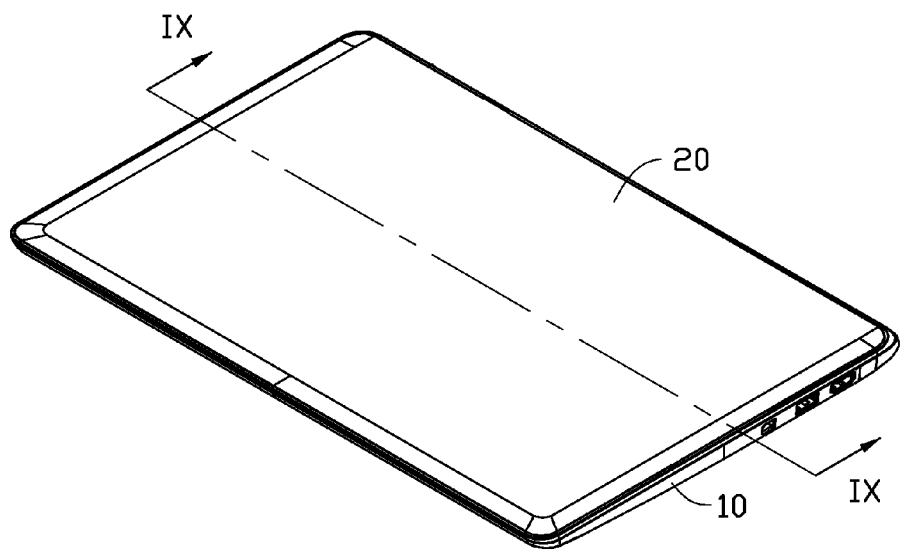
FIG. 8 is an assembled, isometric view of the electronic device of FIG. 1.

FIG. 2 and FIG. 3 show that the display 20 comprises a cover 21, a rotating member 23, and a screen 25.

Figure 9:
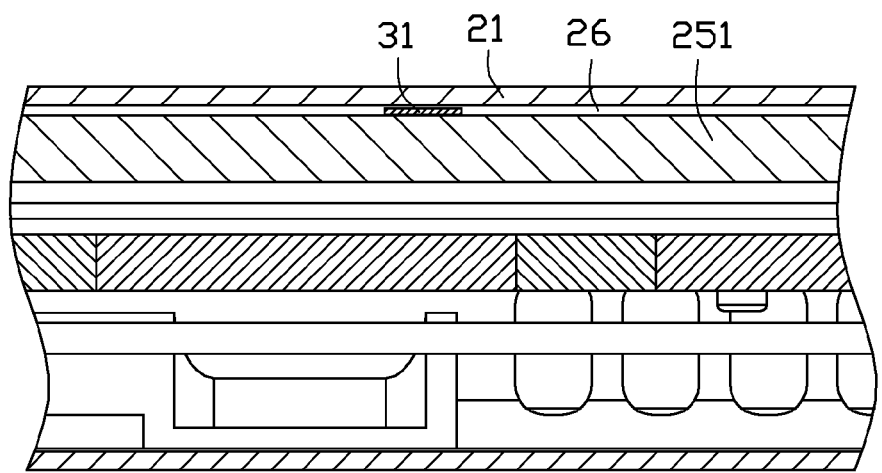
FIG. 9 is a cross sectional view of the assembled electronic device of FIG. 8, taken along a line IX-IX.

The rotating member 23 rotatably secures the display 20 to the base 10. The rotating member 23 can be secured between the cover 21 and the base 10 or secured in a receiving portion 211 of the cover 21. The cover 21 is substantially parallel to the screen 25. The screen 25 comprises a panel 251. A panel connector 251 is mounted on the panel 251. A gap 26 (shown as in FIG. 9) is defined between the cover 21 and the panel 251 for wire tracing.

The electronic device further comprises a connecting member 30 connects the motherboard 13 and the screen 25. The connecting member 30 comprises a flexible printed circuit board (FPCB) 31, a second group of connecting wires 32, and a third group of connecting wires 33. A first group of connecting wires (not shown) are located in the FPCB 31. A width of the FPCB 31 is 0.15-0.2 mm. The FPCB 31 can be traced along the gap 26. The second group of wires 32 are metal wire which can be easily bent or twisted. The third group of wires 33 are metal wire pieces formed by all of the second group of wires 32 abreast together. The third group of connecting wires 33 connect the board connector 131. A thickness of the combined bundle of the third group of connecting wires 33 is greater than the thickness of the FPCB 31. In one embodiment, a cross section of the combined bundle of the second group of connecting wires 32 is circular.

The FPCB 31 comprises a strip portion 313. A first connector 315 is connected to a distal end of the strip portion 313. The second group of connecting wires 32 are electronically connected between a first end of the third group of connecting wires 33 and the FPCB 31. A second connector 332 is connected to a second end of the third group of connecting wires 33. In one embodiment, the second group of connecting wires 32 is electronically connected to the FPCB 31 by spot welding at a welding spot 35.

FIGS. 4-9 show that in assembly, a part of the FPCB 31 is located below the screen 25, and the strip portion 311 is inserted into the gap 26. The strip portion 311 is secured to the cover 21 and faces the screen 25. The first connector 315 is electronically connected to the screen connector 253. Each individual wire of the second group of connecting wires 32 comprises a spiral portion 323. The spiral portion 323 twines around the rotating member 23. The spiral portion 323 and the welding spot 35 are located in the receiving portion 211. The second group of connecting wires 32 extends out of the receiving portion 211. The second connector 332 is electronically connected to the board connector 131.

The lower limit of the thickness of the display is determined by the thickness of FPCB 31. In this embodiment, a depth of the gap 26 is greater than 0.15 mm and less than 0.5 mm because the thickness of the FPCB 31 is 0.15-0.2 mm. In one embodiment, the thickness of the FPCB 31 is 0.16-0.21 mm. Thus, a distance between the cover 21 and the screen 25 is decreased, so that a thickness of the display 20 is decreased.

When the rotating member 23 is rotated, the rotating member 23 and the spiral portion 323 may come into contact with each other. To prevent the second group of connecting wires 32 from being damaged, the second group of connecting wires 32 are made of metal with an abrasion resistant layer around each of the second group of connecting wires 32 and the combined bundle of the second group of connecting wires 32.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and the arrangement of parts within the principles of the disclosure, to the full extent indicated by the broad general meaning of the terms in which the appended claims are expressed.

What is claimed is:

1. An electronic device, comprising:
   a base comprising a motherboard;
   a display rotatably mounted to the base and comprising a cover and a screen; and
   a connecting member configured for connecting the display and the motherboard and comprising a second group of connecting wires and a flexible printed circuit board (FPCB) with a first group of connecting wires connected to the second group of connecting wires;
   wherein a gap is defined between the cover and the screen; the first group of connecting wires are electronically connected to the screen; the second group of connecting wires are electronically connected to the motherboard; and the FPCB extends into the gap.

2. The electronic device of claim 1, wherein a depth of the gap is greater than 0.15 mm and less than 0.5 mm.

3. The electronic device of claim 2, wherein the depth of the gap is 0.16-0.21 mm.

4. The electronic device of claim 1, wherein each individual wire of the second group of wires is a metal wire.

5. The electronic device of claim 4, wherein the second group of connecting wires are bundled together and a cross section of a bundle of the second group of connecting wires is circular.

6. The electronic device of claim 1, wherein the first group of connecting wires are secured to the cover and face the screen.

7. The electronic device of claim 1, wherein the first group of connecting wires are welded with the second group of connecting wires at a welding spot.

8. The electronic device of claim 7, further comprising a rotating member rotatably connect the base to the displayer, wherein the cover comprises a receiving portion, and the welding spot is located in the receiving portion.

9. The electronic device of claim 8, wherein each individual wire of the second group of connecting wires comprises a spiral portion twines around the rotating member, and the spiral portion and the rotating member are located in the receiving portion.

10. The electronic device of claim 1, wherein the connecting member further comprises a third group of connecting wires formed by the bundle of the second group of wires abreast together, and the third group of connecting wires are electronically connected to the second group of connecting wires and the motherboard.

11. An electronic device, comprising:
    a base comprising a motherboard;
    a display rotatably mounted to the base and comprising a cover and a screen; and
    a connecting member configured for connecting the display and the motherboard, the connecting member comprising a second group of connecting wires and a flexible printed circuit board (FPCB) with a first group of connecting wires connected to the second group of connecting wires;
    wherein a gap is defined between the cover and the screen; the first group of connecting wires are electronically connected to the screen; the second group of connecting wires are electronically connected to the motherboard; the FPCB extends into the gap; and a depth of the gap is greater than 0.15 mm and less than 0.5 mm.

12. The electronic device of claim 11, wherein the depth of the gap is 0.16-0.21 mm.

13. The electronic device of claim 11, wherein each individual wire of the second group of wires is a metal wire.

14. The electronic device of claim 13, wherein the second group of connecting wires are bundled together and a cross section of a bundle of the second group of connecting wires is circular.

15. The electronic device of claim 11, wherein the first group of connecting wires are secured to the cover and face the screen.

16. The electronic device of claim 11, wherein the first group of connecting wires are welded with the second group of connecting wires at a welding spot.

17. The electronic device of claim 16, further comprising a rotating member rotatably connect the base to the displayer, wherein the cover further comprises a receiving portion, and the welding spot is located in the receiving portion.

18. The electronic device of claim 17, wherein each individual wire of the second group of connecting wires comprises a spiral portion twines around the rotating member, and the spiral portion and the rotating member are located in the receiving portion.

19. The electronic device of claim 11, wherein the connecting member further comprises a third group of connecting wires formed by the bundle of the second group of wires abreast together, and the third group of connecting wires are electronically connected to the second group of connecting wires and the motherboard.

* * * * *